United States Patent
Cooray

(10) Patent No.: US 6,749,927 B2
(45) Date of Patent: Jun. 15, 2004

(54) DIELECTRIC RESIN COMPOSITION AND MULTILAYER CIRCUIT BOARD COMPRISING DIELECTRIC LAYERS FORMED THEREFROM

(75) Inventor: Nawalage Florence Cooray, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 45 days.

(21) Appl. No.: 10/042,308

(22) Filed: Jan. 11, 2002

(65) Prior Publication Data
US 2002/0131247 A1 Sep. 19, 2002

(30) Foreign Application Priority Data

Jan. 12, 2001 (JP) .................................... 2001-005369
Jun. 18, 2001 (JP) .................................... 2001-183776

(51) Int. Cl.$^7$ ........................ B32B 15/00; C08F 283/00
(52) U.S. Cl. ..................... 428/209; 428/446; 428/458; 428/461; 428/470; 428/473.5; 428/689; 428/704; 428/901; 525/523; 525/481; 525/526; 525/528
(58) Field of Search ................ 525/523, 481, 525/526, 528; 428/901, 209, 458, 461, 470, 473.5, 689, 704, 446

(56) References Cited

U.S. PATENT DOCUMENTS 5,856,379 A * 1/1999 Shiratsuchi et al. ........ 523/209
5,912,308 A * 6/1999 Das et al. .................. 525/480

* cited by examiner

Primary Examiner—Deborah Jones
Assistant Examiner—Ling Xu
(74) Attorney, Agent, or Firm—Armstrong, Kratz, Quintos, Hanson & Brooks, LLP

(57) ABSTRACT

A dielectric resin composition comprising at least one type of epoxy resin and at least one type of cyanate ester which would react with said epoxy resin, together with a metal ion catalyst system, the ratio of the epoxy functional groups of said epoxy resin to the cyanate groups of said cyanate ester being in the range of from 1:0.8 to 1:1.4. Alternatively, a dielectric resin composition according to the invention may comprise a polyimide resin with side chain epoxy groups, a cyanate ester with two or more cyanate groups in the molecule, and a metal ion catalyst system. A multilayer circuit board having a multilayer structure comprising a core substrate and a required number of dielectric layers and wiring layers stacked alternately, wherein at least one of the dielectric layers is formed from a dielectric resin composition of the invention, is also disclosed.

19 Claims, 1 Drawing Sheet

DIELECTRIC RESIN COMPOSITION AND MULTILAYER CIRCUIT BOARD COMPRISING DIELECTRIC LAYERS FORMED THEREFROM

BACKGROUND OF THE INVENTION

1. Field of the Invention

The present invention relates to a dielectric resin composition, and more specifically it relates to a dielectric resin composition comprising an epoxy resin and a cyanate ester which would react with the epoxy resin, and to a dielectric resin composition comprising a polyimide with epoxy groups on the polymer side chain and a cyanate ester which would react therewith. Cured resins obtained from the composition of the invention have low dielectric constant, and the compositions are therefore particularly suitable for use as interlayer dielectric in multilayer circuit boards such as MCM-L/D (Multi-Chip Module-Laminate/Deposited) boards or single chip packages, such as CSP.

2. Description of the Related Art

Printed circuit boards are commonly used to integrate electronic parts into electronic devices. The usual process for manufacturing printed circuit boards involves hot pressing together a dielectric resin layer and a copper or other metal layer as the wiring layer, followed by etching of the metal layer according to an electronic circuit pattern. This process is cost effective, but cannot be applied to manufacture high-density circuit boards. On the other hand, build-up multilayer wiring boards have long been used for hybrid ICs, and these are fabricated by alternately printing a patterned conductor and a prepreg of a dielectric on a ceramic substrate in stacked layers and baking them together.

Due to increasing demand for small feature sizes, higher performance and low cost for electronic devices in recent years, high-density wiring boards have become essential. In the field of printed boards, the rapidly increasing miniaturization and multilayer constructions of electronic circuits and higher density mounting of electronic parts has led to more active research on thin-film multilayer build-up printed circuit boards. In build-up printed circuit boards, the dielectric layers and patterned copper wiring layers are alternately stacked, and interconnections between upper and lower wiring layers are established through via holes formed in the dielectric layers.

A common method for manufacture of build-up printed boards will now be explained, with reference to FIG. 1. First, both sides of the core substrate 1 which comprises a dielectric resin reinforced with a filler such as glass fibers, copper wiring layers 7 with fine patterns on both sides thereof, throughholes 5 (filled with a dielectric resin 4) to connect the wiring layers 7 on both sides, and a wiring layer 8 formed inside the substrate itself are coated with a photosensitive dielectric material, and are then exposed to lights (or irradiated) and developed to form the dielectric layer 2 with via holes. A copper thin film is then deposited on the dielectric layer 2 by electroless plating followed by electroplating, and this Cu layer is patterned to form the copper wiring layer 3. Next, if necessary, the steps from formation of the dielectric layer 2 to formation of the wiring layer 3 are repeated to produce a multilayer circuit board 10. Thereafter, the solder resist layer 22 is deposited, irradiated and developed. Finally, solder bumps 21 are formed on the uppermost wiring layer of the circuit board in order to make connection with the outer circuit.

The photosensitive resin composition used to form the dielectric layer of the multilayer circuit board can be developed either by an organic solvent or an aqueous alkaline solution. Examples of photosensitive resin compositions that can be developed by alkaline agents include photosensitive compositions in which base polymers are reaction products of unsaturated monocarboxylic acids with epoxy resins, with further addition of polybasic acid anhydrides (Japanese Examined Patent Publication No. 56-40329 (JP-B-56-40329) and Japanese Examined Patent Publication No. 57-45785 (JP-B-57-45785)), and alkali-developing photosensitive compositions with excellent heat resistance and chemical resistance, which employ novolac-type epoxy resins (Japanese Unexamined Patent Publication No. 61-243869 (JP-A-61-243869)).

In order to obtain a high-density build-up printed circuit board it is necessary to create micro-vias in the build-up dielectric layers. Since micro-vias are usually created by laser methods, the dielectric materials must be laser compatible, or in other words, the dielectric material should not contain materials such as glass fiber reinforcements. The dielectric material should be ductile enough to get a build-up printed board with no micro-cracks. Thus, unlike the core substrate, the material for the build-up dielectric layer must be selected with great care.

Epoxy resins cured with amines, acid anhydrides or phenols are widely used as dielectric materials in printed circuit boards mainly because of their low cost and ease of processing. However, since epoxy dielectric materials are thermally unstable at temperatures exceeding 200° C., and especially in temperature ranges exceeding 250° C., and have high dielectric constant and dielectric loss (due to free —OH and —NH groups in the cured product), and high flammability, they are found to be not promising materials in high-density printed circuit boards. Although epoxy materials with high percentage of bromine are currently in wide use to improve the flame resistance of dielectric materials, it has been found that if brominated dielectrics are used in fine-patterned printed circuit boards, Br migration occurs at high temperature and high humidity conditions.

Epoxy/cyanate ester resins with no —OH or —NH groups have been reported in Electronic Materials Handbook, Volume 1, Packaging (1989), p.606, and these may be expected to exhibit satisfactory thermal characteristics and electrical characteristics compared with the conventional epoxy resins cured with amines, acid anhydrides or phenol curing agents. However, these resins are very brittle, and their thermal and electrical characteristics are largely dependent on the epoxy/cyanate ester ratio, the curing conditions and the curing catalyst. Although some limited studies have been reported on epoxy/cyanate ester systems, no reports have been found regarding materials suitable for high-density printed boards.

The use of polyimide resins is known to be effective to eliminate the problems described above, but polyimides have to be cured at high temperatures (>350° C.) and therefore require to use with highly heat-resistant core substrates. Because of the high cost of highly heat-resistant substrates, particularly silicon or aluminum nitride substrates, it is very difficult to produce low cost PWBs with polyimide dielectric materials. Other low temperature processable dielectric materials include soluble polyimides, but since the cured films of the polyimides are susceptible to solvents, it is difficult to use them in multilayer circuit boards. Although numerous low-temperature curing imide oligomers with thermosetting reactive groups on both ends have been reported, due to their low molecular weights, it is very difficult to get defect-free dielectric film on substrates.

SUMMARY OF THE INVENTION

An object of the present invention is to provide a dielectric resin composition with promising thermal and electrical characteristics, and particularly dielectric characteristics, which can form cured films with excellent mechanical properties and moisture resistance, and which is particularly suitable for formation of interlayer dielectrics of multilayer circuit boards such as MCM-L/D boards or single chip packages. Another object of the invention is to provide multilayer circuit boards using this resin composition as the interlayer dielectric.

According to the first aspect, the dielectric resin composition of the invention comprises at least one type of epoxy resin and at least one type of cyanate ester which would react with the epoxy resin, together with a metal ion catalyst. The ratio of the epoxy functional groups of the epoxy resin to the cyanate groups of the cyanate ester is preferably in the range of from 1:0.8 to 1:1.4.

According to the second aspect, the dielectric resin composition of the invention comprises a polyimide resin with side chain epoxy groups, a cyanate ester with two or more cyanate groups in the molecule, and a metal ion catalyst.

Multilayer circuit boards according to the invention comprise a core substrate, and a prescribed number of dielectric layers and wiring layers which are stacked alternately, wherein at least one of the dielectric layers is formed from the dielectric resin composition of the invention.

BRIEF DESCRIPTION OF THE DRAWING

The above and other objects and advantages of the invention will be well understood and appreciated by a person with ordinary skill in the art, from consideration of the following detailed description made by referring to the attached drawing, wherein.

DETAILED DESCRIPTION OF THE INVENTION

Figure 1:
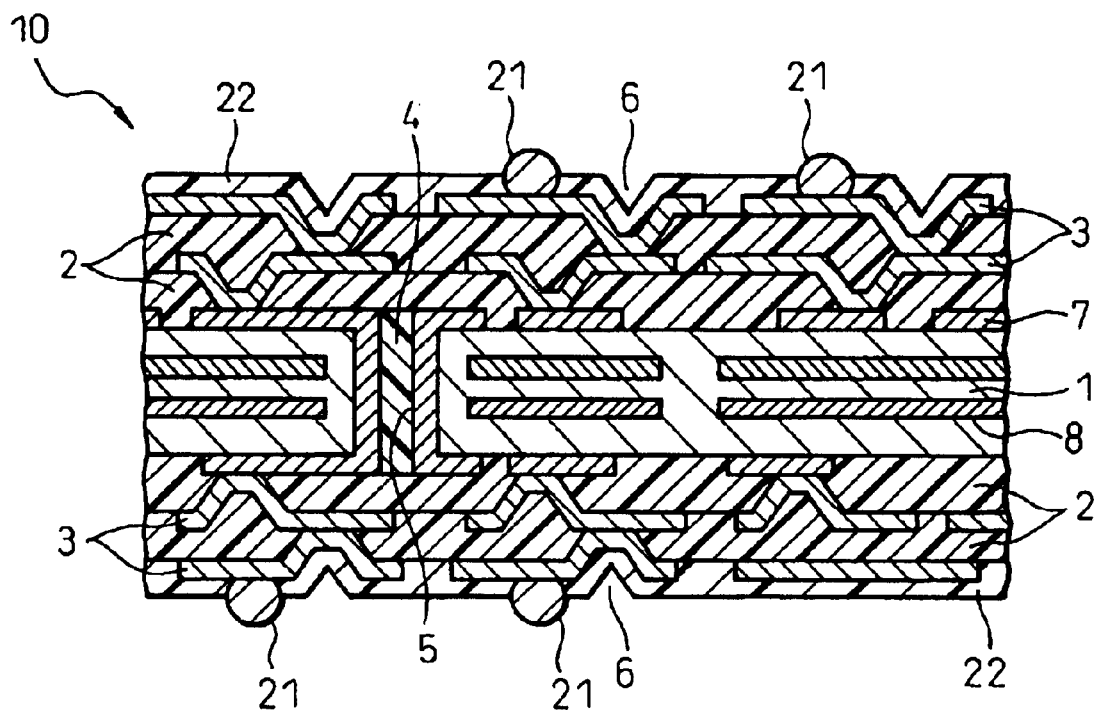
FIG. 1 is an illustration of a multilayer circuit board.

The dielectric resin composition according to the first aspect of the invention is a thermosetting composition comprising at least one type of epoxy resin as the base resin and at least one type of cyanate ester which can react with the epoxy resin and which functions as a curing agent for curing of the epoxy resin, as well as a metal ion catalyst which accelerates the curing reaction.

The epoxy resin as the base resin is a polyfunctional epoxy compound which has two or more epoxy groups in the molecule and is capable of forming thin films after curing with a cyanate ester curing agent. Suitable epoxy resins for use in the dielectric composition of the invention include aromatic epoxy resins, alicyclic epoxy resins and their mixtures. Aromatic epoxy resins preferably have two or more epoxy groups. Suitable examples of aromatic epoxy resins include tetrabromobisphenol A epoxy resins (for example, EPICLON 153 from Dainippon Ink and Chemicals) and bisphenol F epoxy resins. Suitable examples of alicyclic epoxy resins include ARALDITE CY179 (Ciba-Geigy), EHPE-3150 (Dicell Chemicals), EPOLITE GT-300 and GT-400 (Dicell Chemicals).

The cyanate esters used as the curing agent include any cyanate ester having two or more cyanate groups in the molecule and that would react with the epoxy resin. Preferred cyanate esters used in the invention include Primeset PT-15, PT-30, PT-60S, CT-90 and BA-230S, which are commercially available from Lonza Co.

According to the first aspect of the composition of the invention, the epoxy resin contributes toughness and flexibility to the cured product, while the cyanate ester contributes low dielectric constant and high moisture resistance to the cured product. In order to get promising electrical and mechanical properties as an interlayer dielectric in multilayer circuit boards, the ratio of the epoxy functional groups of the epoxy resin to the cyanate groups of the cyanate ester is preferably from 1:0.8 to 1:1.4, and more preferably from 1:0.8 to 1:1. Excess epoxy functional groups in the composition tend to raise the dielectric constant and the moisture absorption, while excess cyanate groups tend to lower the flexibility of the cured product. The best properties including the mechanical strength, flexibility, dielectric constant and moisture resistance can be obtained when epoxy/cyanate ratio is 1:1.

The curing reaction between the epoxy resin and the cyanate ester of the composition according to the first aspect of the invention can be accelerated by a metal ion catalyst. Preferred metal ion catalysts include acetylacetonates of Cu(II), Co(II), Zn(II) and Mn(II). The catalyst is present in an active metal ion content of from 100 parts to 500 parts per 1 million parts of the resin composition, and preferably 100 parts to 200 parts per 1 million parts of the resin system. If the catalyst is used in an amount within this range, the composition according to the first aspect of the invention can be cured in 1–3 hours at a temperature in the range of 180–200° C. In some cases, a mixture of different catalysts may also be used.

The dielectric resin composition according to the second aspect of the invention is a low-temperature (150–250° C.) curing polyimide composition comprising an epoxy-functional polyimide resin (polyimide with side chain epoxy groups) as the base material, and a cyanate ester with two or more cyanate groups-in the molecule as the epoxy hardener, and a metal ion catalyst to accelerate the curing reaction between the side chain epoxy groups of the polyimide and the cyanate groups of the cyanate ester.

The polyimides with side chain epoxy groups are soluble in organic solvents and can be prepared by epoxidation of polyimide with side chain hydroxyl groups. The polyimides can be prepared by imidization of polyamic acid precursor that can be synthesized by polymerization of diamines and tetracarboxylic dianhydrides (at least one of which, usually at least the diamine, has a hydroxyl group) in polar aprotic solvents.

Suitable diamines for synthesis of polyimides include 4,4'-diamino-4"-hydroxytriphenylmethane, 4,4'-diamino-4"-hydroxytriphenylamine, 2,4-diaminophenoldihydrochloride, and the like.

Suitable examples of tetracarboxylic dianhydrides include 3,3',4,4'-benzophenonetetracarboxylic dianhydride, 3,3',4, 4'-biphenyltetracarboxylic dianhydride, 3,3',4,4'-diphenylethertetracarboxylic dianhydride, 3,3',4,4'-diphenylhexafluoropropanetetracarboxylic dianhydride, 3,3',4,4'-diphenysulfonetetracarboxylic dianhydride, pyromellitic dianhydride, cyclohexanetetracarboxylic dianhydride, and mixtures thereof.

The polar aprotic solvent may be any solvent which can dissolve the polyamic acid intermediates of the invention. Examples of organic solvents may include tetrahydrofuran, dioxane, N,N'-dimethylformamide, N,N-dimethylacetamide, N-methylpyrrolidone, hexamethylphosphoramide and γ-butyrolactone.

The temperature of the polymerization reaction of diamines and tetracarboxylic dianhydrides may be in the range of from −10° C. to 150° C., and preferably from 0° C. to 50° C. The resulting polyamic acid intermediate is preferably purified prior to imidization. Purification of the intermediate may be accomplished by, for example, pouring the reaction mixture into a solvent such as methanol to precipitate the intermediate, dissolving the precipitate in another solvent (N-methylpyrrolidone (NMP) or the like) and reprecipitating in methanol.

The polyamic acid precursors can be imidized by thermal or a chemical means. The thermal dehydration reaction is carried out in a solvent at a temperature in the range of from 50 to 300° C., preferably from 120 to 150° C. Acetic anhydride and trifluoroacetic anhydride are most effective as chemical dehydration agent. Other suitable examples include dicyclohexylcarbodiimide (DCC), thionyl chloride, phosphorus trichloride, pyridine and the like.

The polyimide obtained by the ring closure reaction is preferably purified prior to epoxidation. The purification may be carried out in the same manner as purification of the intermediate, for example, by pouring the reaction solution into a solvent such as methanol for precipitation, redissolving the precipitate in another solvent (N-methylpyrrolidone (NMP) or the like) and pouring this solution back into a solvent such as methanol for reprecipitation.

The polyimides with side chain hydroxyl groups obtained in this manner are then subjected to epoxidation. The epoxidation may be accomplished by heating the hydroxyl containing polyimide together with epichlorohydrin in the presence of a catalyst (generally at 80–120° C. and preferably at 90–100° C. ) such as benzyltrimethylammonium chloride (BTMA) or the like. The epoxy-modified polyimide obtained in this manner has side chain epoxy groups, and depending on the case, there is no problem if it also has epoxy groups on both ends of the linear main chain. The epoxy-modified polyimide in the composition according to the second aspect of the invention preferably has a number average molecular weight (Mn) of 5000 to 1 million. With a composition containing an epoxy-modified polyimide with a number average molecular weight of less than 5000, it is difficult to form films of the desired thickness on the coating substrate, whereas polyimides with a number average molecular weight of greater than 1 million tend to impede coatability onto the substrate. The preferred number average molecular weight for the epoxy-modified polyimide is in a range of from 10,000 to 1 million.

According to the invention, the polyimide with side chain epoxy groups would react with the cyanate ester curing agent with two or more cyanate groups in the molecule to form dielectric films with excellent thermal, electrical and mechanical properties, and excellent moisture resistance as well. The same cyanate ester curing agent with two or more cyanate groups in the molecule used in the first aspect of the invention can also be used here as well. Preferred examples of cyanate esters include Primeset PT-15, PT-30, PT-60 and CT-90 which are commercially available from Lonza Co., and mixtures thereof.

The ratio of the epoxy functional groups of the epoxy-modified polyimide to the cyanate groups of the cyanate ester in the second composition of the invention is preferably from 1:0.8 to 1:1.4, and more preferably from 1:0.8 to 1:1.0. An excess of epoxy functional groups raises the dielectric constant of the cured product, while excess cyanate groups tend to lower the flexibility of the cured product.

The curing reaction between the epoxy groups of the polyimide and the cyanate groups of the curing agent in the composition according to the second aspect of the invention can be accelerated by a metal ion catalyst. Preferred metal ion catalysts include acetylacetonates of Cu(II), Co(II), Zn(II) and Mn(II). Preferred active ion content of the catalyst would be in the range of from 100 to 500 parts per 1 million parts of the resin system, and preferably 100–200 parts per 1 million parts of the resin system. If the catalyst system is used in an amount within this range, the composition according to the second aspect of the invention can be cured in 1–3 hours at a temperature in the range of 180–250° C. In some cases, a mixture of different catalyst systems may also be used.

Both the compositions according to the first and second aspects of the invention may contain non-polymerizable additives such as thixotropic agents or leveling agents, if necessary, to improve the film forming ability of the composition. A typical example of thixotropic agents is colloidal silica, which is usually used in an amount of 3–10 wt % of the total solid of the dielectric resin composition. A typical example of leveling agents is polyacrylate, which is usually used in an amount of 0.25–1 wt % of the total solid of the dielectric resin composition. Other additives may also be used.

The composition of the invention will generally be coated as a varnish onto a core substrate with Cu fine wiring patterns. Such a varnish is prepared by dissolving the resin composition of the invention in an appropriate organic solvent. Preferred examples of solvents for the composition according to the first aspect of the invention include propyleneglycolmonomethylether acetate, ethyleneglycol monomethylether acetate, cyclohexanone and methyl isobutyl ketone. Other solvents such as dimethylacetamide, N-methylpyrrolidone, xylene, methyl ethyl ketone, monoethylether glycol, or the like, may also be used. Examples of suitable solvents for the resin composition according to the second aspect of the invention include propyleneglycolmonoethyl ethers, acetates, cyclohexane, dioxane, tetrahydrofuran, N,N-dimethylformamide, N,N-dimethylacetamide, N-methylpyrrolidone, hexamethylphosphoramide, γ-butyrolactone and the like. In either cases, the solvent may be used alone or as a mixture of two or more different solvents. Typically, solutions of the resin composition are applied to the substrates with solid contents of about 1–60%, and preferably 5–40%.

The varnish is coated onto a Cu-wiring fine-patterned circuit board by a method such as screen printing, curtain coating, roll coating or spin coating, so as to obtain a dielectric layer with the desired film thickness (for example, 40 μm). This is followed by drying at 100–120° C. for 10–20 minutes to remove the residual solvent in the film. In the case of a composition according to the first aspect of the invention, the dried film is then cured at a temperature of 150–200° C. and preferably 180–200° C., for 1–3 hours and preferably 1–2 hours. In the case of a composition according to the second aspect of the invention, the dried film is cured at a temperature of 180–250° C. and preferably 200–250° C., for 1–3 hours and preferably 1–2 hours. Next, via holes are created at locations through which upper and lower layers are to be connected, using laser methods, for example, $CO_2$ laser, excimer laser or YAG laser.

A copper thin film is then formed on the dielectric layer in which the via holes have been opened. The circuit board with dielectric layers is immersed in an aqueous alkaline $KMnO_4$ solution, in order to make micro-cavities in the dielectric surface, through these cavities the conductor is anchored to the dielectric surface, thus improving Cu/dielectric adhesion (roughening treatment). Next, a copper thin film is deposited on the dielectric layer surface by electroless plating followed by electroplating.

Finally, the copper thin film is patterned according to the circuit pattern by a wet etching process.

Repetition of the above processes including the dielectric layer formation, via hole formation, copper thin film formation and patterning several times, if necessary, gives multilayer build-up circuit boards. The multilayer build-up circuit board has a structure similar to that shown in FIG. 1 referred to above. As a more detailed explanation again referring to this drawing, the multilayer circuit board 10 of the invention comprises a required number of wiring layers 3 formed on both sides of a core substrate 1 which comprises a dielectric resin reinforced with a filler such as glass fibers, copper wiring layers 7 with fine patterns on both sides thereof, throughholes 5 (filled with a dielectric resin 4) to connect the wiring layers 7 on both sides, and a wiring layer 8 formed inside the substrate itself, and a dielectric layer 2 positioned under each wiring layer 3 and provided with via holes 6 for connection between the upper and lower wiring layers. Depending on the case, some of the multiple dielectric layers 2 on each side of the core substrate may be formed from a material other than the composition of the invention. The multilayer circuit board 10 shown in FIG. 1 is also provided with solder bumps 21 formed in contact with the uppermost wiring layer for connection with the outer circuit and a solder resist layer 22 which also functions as a protective layer.

The composition according to the second aspect of the invention, i.e., the composition whose base resin is a polyimide with side chain epoxy groups, has a notable feature in that it exhibits adhesion. Taking advantage of this property, the composition according to the second aspect of the invention may be used to attach a multilayer wiring structure formed independently and separately from the core substrate (a laminated structure composed of a prescribed number of dielectric layers and wiring layer) onto the core substrate. The composition used as an adhesive functions as a dielectric material after attachment, performing the role of a dielectric layer for the multilayer wiring structure. In this case, the dielectric layer in the separately formed multilayer wiring structure is preferably formed from a composition according to the invention, and the core substrate to which the separately formed multilayer wiring structure is bonded may be already provided with part of the multilayer wiring structure, or completely lacking it. By thus utilizing the composition as an adhesive, the scope of manufacturing techniques for multilayer circuit boards is further widened. The structure of a multilayer circuit board manufactured utilizing this composition as an adhesive is essentially the same as that explained with reference to FIG. 1 above.

EXAMPLES

The present invention will now be explained in greater detail by way of examples, with the understanding that these examples are only illustrative and are in no way intended to restrict the scope of the invention.

Example 1

A coating varnish was prepared by dissolving and dispersing 65 parts by weight of tetrabromobisphenol A epoxy resin (EPICLON 153 by Dainippon Ink and Chemicals), 25 parts by weight of alicyclic epoxy resin (ARALDITE CY179 by Ciba-Geigy), 10 parts by weight of bisphenol A polyol epoxy resin (BEO-6E by New Japan Chemical Co., Ltd.), 87 parts by weight of cyanate ester (PT-30 by Lonza Co.), 6 parts by weight of colloidal silica, 0.25 part by weight of polyacrylate and 0.01 part by weight of copper (II) acetylacetonate in 20 parts by weight of propyleneglycol monomethylether acetate and 30 parts by weight of cyclohexanone. The varnish was coated on a Cu substrate by using a doctor-blade to form 100 µm thick dielectric films. Next, the film was prebaked for 20 minutes in an air oven at 120° C., and then cured at 200° C. for 2 hours to form a dielectric film. Via holes were then opened in the dielectric layer by a mechanical or a laser drilling method.

Next, a copper thin film was formed on the dielectric surface as explained below. First, the dielectric layer formed on a copper substrate was immersed in a conditioner (Shiplay Co.) at 60° C. for 10 minutes, in a promoter (Shiplay Co.) at 70° C. for 10 minutes, and then in a neutralizer (Shiplay Co.) at 60° C. for 10 minutes consecutively. A copper thin film (25 µm) was then formed by electroless plating followed by electroplating. The peel strength between the copper thin film and the underlying dielectric layer was measured to be 9.8 N/cm (1000 gf/cm).

The varnish was also coated onto an aluminum substrate and cured under the same conditions described above, after which the cured film was peeled off to get a free-standing dielectric films (40 µm thickness). These films were subjected to physical property measurement including tensile strength, elongation at break, dielectric constant and moisture absorption, as well as differential scanning calorimetry (DSC) and thermal mechanical analysis (TMA). The results are summarized in Table 1.

The varnish was also coated onto a BT (bismaleimide triazine) substrate having Cu fine patterns (line/space=60 µm/60 µm). After curing under the same conditions described above, the dielectric thin film (70 µm thickness) was subjected to unsaturated pressure cooker bias test (USPCBT) under the following conditions: temperature= 120° C., relative humidity=85%, pressure=172 kPa (1.7 atm), voltage=24 V, time=96 hours. During the test, no notable change in the dielectric resistance was observed, and it remained unchanged in the order of $1 \times 10^7$ ohms.

Example 2

A coating varnish was prepared by dissolving and dispersing 65 parts by weight of tetrabromobisphenol A epoxy resin (EPICLON 153 by Dainippon Ink and Chemicals), 25 parts by weight of alicyclic epoxy resin (ARALDITE CY179 by Ciba-Geigy), 10 parts by weight of bisphenol A polyol epoxy resin (BEO-6E by New Japan Chemical Co., Ltd.), 87 parts by weight of cyanate ester (PT-30 by Lonza Co.), 6 parts by weight of colloidal silica, 0.25 part by weight of polyacrylate and 0.01 part by weight of copper (II) acetylacetonate in 20 parts by weight of propyleneglycol monomethylether acetate and 30 parts by weight of cyclohexanone. The varnish was coated on a Cu substrate by using a doctor-blade to form 100 µm thick dielectric films. Next, the film was prebaked for 20 minutes in an air oven at 120° C., and then cured at 180° C. for 2 hours to form a dielectric film. Testing was conducted in the same manner explained in Example 1. The results are summarized in Table 1.

Example 3

A coating varnish was prepared by dissolving and dispersing 65 parts by weight of tetrabromobisphenol A epoxy resin (EPICLON 153 by Dainippon Ink and Chemicals), 25 parts by weight of alicyclic epoxy resin (ARALDITE CY179 by Ciba-Geigy), 10 parts by weight of bisphenol A polyol epoxy resin (BEO-6E by New Japan Chemical Co., Ltd.), 108.5 parts by weight of cyanate ester (PT-30 by Lonza Co.), 6 parts by weight of colloidal silica, 0.25 part by weight of polyacrylate and 0.01 part by weight of copper (II) acetylacetonate in 25 parts by weight of propyleneglycol monomethylether acetate and 30 parts by weight of cyclohexanone. The varnish was coated on a Cu substrate by using a doctor-blade to form 100 μm thick dielectric films. Next, the film was prebaked for 20 minutes in an air oven at 120° C., and then cured at 200° C. for 2 hours to form a dielectric film. Testing was conducted in the same manner explained in Example 1. The results are summarized in Table 1.

Example 4

A coating varnish was prepared by dissolving and dispersing 65 parts by weight of tetrabromobisphenol A epoxy resin (EPICLON 153 by Dainippon Ink and Chemicals), 25 parts by weight of alicyclic epoxy resin (ARALDITE CY179 by Ciba-Geigy), 10 parts by weight of bisphenol A polyol epoxy resin (BEO-6E by New Japan Chemical Co., Ltd.), 108.5 parts by weight of cyanate ester (PT-30 by Lonza Co.), 6 parts by weight of colloidal silica, 0.25 part by weight of polyacrylate and 0.01 part by weight of copper (II) acetylacetonate in 25 parts by weight of propyleneglycol monomethylether acetate and 30 parts by weight of cyclohexanone. The varnish was coated on a Cu substrate by using a doctor-blade to form 100 μm thick dielectric films. Next, the film was prebaked for 20 minutes in an air oven at 120° C., and then cured at 180° C. for 1 hour to form a dielectric film. Testing was conducted in the same manner explained in Example 1. The results are summarized in Table 1.

Example 5

A coating varnish was prepared by dissolving and dispersing 65 parts by weight of tetrabromobisphenol A epoxy resin (EPICLON 153 by Dainippon Ink and Chemicals), 25 parts by weight of alicyclic epoxy resin (ARALDITE CY179 by Ciba-Geigy), 10 parts by weight of bisphenol A polyol epoxy resin (BEO-6E by New Japan Chemical Co., Ltd.), 130.5 parts by weight of cyanate ester (PT-30 by Lonza Co.), 6 parts by weight of colloidal silica, 0.25 part by weight of polyacrylate and 0.01 part by weight of copper (II) acetylacetonate in 30 parts by weight of propyleneglycol monomethylether acetate and 30 parts by weight of cyclohexanone. The varnish was coated on a Cu substrate by using a doctor-blade to form 100 μm thick dielectric films. Next, the film was prebaked for 20 minutes in an air oven at 120° C., and then cured at 200° C. for 2 hours to form a dielectric film. Testing was conducted in the same manner explained in Example 1. The results are summarized in Table 1.

Example 6

A coating varnish was prepared by dissolving and dispersing 65 parts by weight of tetrabromobisphenol A epoxy resin (EPICLON 153 by Dainippon Ink and Chemicals), 25 parts by weight of alicyclic epoxy resin (ARALDITE CY179 by Ciba-Geigy), 10 parts by weight of bisphenol A polyol epoxy resin (BEO-6E by New Japan Chemical Co., Ltd.), 130.5 parts by weight of cyanate ester (PT-30 by Lonza Co.), 6 parts by weight of colloidal silica, 0.25 part by weight of polyacrylate and 0.01 part by weight of copper (II) acetylacetonate in 30 parts by weight of propyleneglycol monomethylether acetate and 30 parts by weight of cyclohexanone. The varnish was coated on a Cu substrate by using a doctor-blade to form 100 μm thick dielectric films. Next, the film was prebaked for 20 minutes in an air oven at 120° C., and then cured at 180° C. for 2 hours to form a dielectric film. Testing was conducted in the same manner explained in Example 1. The results are summarized in Table 1.

TABLE 1

| Sample | Epoxy:cyanate ratio | Curing conditions (° C./min) | Tensile strength (MPa) | Elongation (%) | Weight-loss on-set temperature (° C.) | Tg (° C.) | ε (1 MHz) | Coefficient of thermal expansion* ($10^{-6}$) |
|---|---|---|---|---|---|---|---|---|
| Example 1 | 1:0.8 | 200/120 | 70 | 3.5 | 225 | 142 | 4.1 | 50/180 |
| Example 2 | 1:0.8 | 180/120 | 55 | 4.5 | 230 | 140 | 3.7 | 48/185 |
| Example 3 | 1:1 | 200/120 | 95 | 8 | 265 | 160 | 2.9 | 27/65/— |
| Example 4 | 1:1 | 180/120 | 80 | 6 | 250 | 150 | 3.5 | 29/64/185 |
| Example 5 | 1:1.2 | 200/120 | <50 | 2.5 | 240 | 165 | 3.5 | — |
| Example 6 | 1:1.2 | 180/120 | <45 | 2.5 | 240 | 168 | 3.1 | — |

Tg: Glass transition temperature
*Both CTE values below and above the glass transition temperature are given. In the cases of Examples 3 and 4, two CTE values were observed in different temperature ranges below the Tg.

Example 7

After dissolving 29.0 g (100 mmol) of 4,4'-diamino-4"-hydroxytriphenylmethane in 300 ml of N-methylpyrrolidone (NMP) in a dry nitrogen atmosphere, 31.0 g (100 mmol) of 3,3',4,4'-biphenylethertetracarboxylic dianhydride (3,3',4,4'-oxydiphthalic anhydride) was added while stirring at 25° C., and the reaction was continued at 25° C. for 3 hours. The reaction solution was then poured into methanol, and the precipitated product was filtered, and washed with methanol. The powdery product obtained was then dissolved in NMP and poured into methanol for reprecipitation. The final product was dried in a vacuum over at 50° C. for 12 hours to get the polyamic acid precursor.

The polyamic acid precursor was dispersed in 200 ml of xylene and refluxed for 90 minutes for polyimide ring closure reaction. The reaction solution was then poured into methanol, and the precipitated polymer product was filtered, and washed with methanol. After repeating the dissolution and precipitation twice with NMP and methanol, the product (hydroxypolyimide) was vacuum dried at 50° C. for 12 hours.

Next, 58 g (100 mmol) of the hydroxypolyimide was dispersed in 1000 g of epichlorohydrin, and 3.7 g (20 mmol) of benzyltrimethylammonium chloride (BTMA) was added while stirring at 100° C., and the mixture was refluxed for 1 hour. The excess epichlorohydrin was then removed by distillation. The remaining solid was dissolved in tetrahydrofuran (THF), and the polymer was pricipitated in ice/water, filtered and washed with excess methanol.

Next, 32 g of the above epoxy-modified polyimide, 7 g of cyanate ester (PT-30 by Lonza Co.) and 3 mg of Cu(II) acetylacetonate were dissolved in 40 ml of 1,3-dimethyl-2-imidazolidinone to prepare a coating varnish. The varnish was coated on a Cu substrate by using a doctor-blade to form 50 µm thick dielectric films. Next, the film was prebaked in an air oven at 120° C. for 20 minutes, and then cured at 200° C. for 2 hours to form a dielectric layer.

After etching the surface of the dielectric with an aqueous alkaline permanganate solution (1 minute at 70° C.), an Ni-B thin film was deposited over the dielectric surface by electroless plating (thickness 0.1 µm; formed by immersion in a sensitizer (okuno Co.) at 30° C. for 3 minutes, in an activator (Okuno Co.) at 30° C. for 1 minute and in an electroless Ni plating solution (Okuno Co.) at 90° C. for 1 minute, consecutively), and then a Cu thin film was deposited by electroplating (thickness 0.5 µm). Thereafter, a positive photoresist (AZ-PLP30, from Hoechst Industries) was coated onto the plated Cu film by spin coating, and the photoresist was then exposed to light (200 mJ/cm$^2$) using a precision exposure apparatus (PLA-510A from Canon Inc.). After resist development, Cu electroplating was carried out (thickness 25 µm) according to the resist pattern. Next, the resist was removed, and Cu and Ni seed layers were etched with a mixture of hydrogen peroxide and sulfuric acid to form Cu wiring patterns. The peel strength of the wiring layer was 10.8 N/cm (1100 gf/cm).

The varnish was also coated onto an aluminum substrate and cured, and then the cured film was peeled off to get free-standing films (20 µm). The thermal decomposition on-set temperature, glass transition temperature (Tg), tensile strength and elongation at break, dielectric constant and moisture absorption of the film were measured. The results are summarized in Table 2.

The varnish was also coated onto a BT substrate with Cu fine patterns (line/space=30/30 µm) and cured to form a dielectric layer (30 µm) on the substrate with Cu-wiring. The dielectric layer was subjected to USPCBT under the following conditions: temperature=120° C., relative humidity=85%, pressure=172 kPa (1.7 atm), voltage=24 V, time=96 hours. The interwiring resistance after the test remained unchanged in the order of 1×10$^7$ ohms.

Example 8

After dissolving 19.6 g (100 mmol) of 2,4-diaminophenol dihydrochloride in 300 ml of NMP in a dry nitrogen atmosphere, 31.0 g (100 mmol) of 3,3',4,4'-biphenylhexafluoropropanetetracarboxylic dianhydride (3,3',4,4'-(hexafluoroisopropylidine) diphthalic anhydride) was added while stirring at 25° C., and reaction was continued at 25° C. for 3 hours. The reaction mixture was then poured into methanol, and the precipitated product was filtered, and washed with methanol. The purification was repeated twice using NMP and methanol. The final product was vacuum dried for 12 hours at 50° C. to obtain the polyamic acid precursor.

The polyamic acid precursor was dispersed in 200 ml of xylene and refluxed for 90 minutes for polyimide ring closure reaction. The reaction solution was then poured into methanol, and the precipitated polymer product was filtered, and washed with methanol. After repeating the dissolution and precipitation twice with NMP and methanol, the product (hydroxypolyimide) was vacuum dried at 50° C. for 12 hours.

Next, 58 g (100 mmol) of the hydroxypolyimide was dispersed in 1000 g of epichlorohydrin, and 3.7 g (20 mmol) of benzyltrimethylammohium chloride (BTMA) was added while stirring at 100° C., and the mixture was refluxed for 1 hour. The excess epichlorohydrin was removed by distillation. The remaining solid was dissolved in THF, and the polymer was precipitated in ice/water, filtered and washed with excess methanol.

Next, 32 g of the above expoxy-modified polyimide, 7 g of cyanate ester (PT-30 by Lonza Co.) and 3 mg of Cu(II) acetylacetonate were dissolved in 40 ml of 1,3-dimethyl-2-imidazolidinone to prepare a coating varnish. The varnish was coated on a Cu substrate by using a doctor-blade to form 100 µm thick dielectric films. Next, the film was prebaked in an air oven at 120° C. for 20 minutes, and then cured at 200° C. for 2 hours to form a dielectric layer.

The rest of the experiments were conducted in the same manner as in Example 7, and the results are summarized in Table 2.

TABLE 2

| Property | Example 7 | Example 6 |
|---|---|---|
| Weight-loss on-set temperature | 290° C. | 300° C. |
| Tg (° C.) | none (up to 250° C.) | none (up to 250° C.) |
| USPCBT | passed | passed |
| Dielectric constant (1 MHZ) | 2.97 | 3.06 |
| Water absorption (%) | 0.8 | 0.4 |
| Tensile strength (MPa) | 60 | 100 |
| Tensile elongation at break (%) | >5 | >6.0 |
| Peel strength (N/cm) | 10.8 | 10.2 |

Thus, according to the present invention it is possible to obtain a dielectric resin compositions which give films with excellent thermal and dielectric, and mechanical properties, and moisture resistance. These materials are particularly suitable for use as interlayer dielectrics in multilayer circuit boards such as MCM-L/D boards or single chip packages. In addition, it is possible to utilize a dielectric resin composition for a multilayer circuit board, which exhibits excellent dielectric and mechanical properties compared to conventional epoxy materials and which can be cured at low temperature. It is also possible to utilize circuit boards comprising interlayer dielectrics with such excellent properties.

What is claimed is:

1. A dielectric resin composition comprising at least one type of epoxy resin which comprises an alicyclic epoxy resin and at least one type of cyanate ester which is reactive with said epoxy resin, together with a metal ion catalyst system, the ratio of the epoxy functional groups of said epoxy resin to the cyanate groups of said cyanate ester being in the range of from 1:0.8 to 1:1.4.

2. A dielectric resin composition according to claim 1, wherein said epoxy resin comprises an aromatic epoxy resin with two or more epoxy groups in the molecule.

3. A dielectric resin composition according to claim 2, wherein said aromatic epoxy resin contains two or more benzene rings.

4. A dielectric resin composition according to claim 1, wherein said cyanate ester has two or more cyanate groups in the molecule.

5. A dielectric resin composition according to claim 1, wherein the ratio of the epoxy functional groups of said epoxy resin to the cyanate groups of said cyanate ester is in the range of from 1:0.8 to 1:1.

6. A dielectric resin composition according to claim 1, wherein said metal ion catalyst system is an acetylacetonate of Cu(II), Co(II), Zn(II) or Mn(II), or a mixture thereof, and is used in an amount such that the active metal ion content is 100–500 parts per 1 million parts of the solid content of said composition.

7. A dielectric resin composition according to claim 1, which can be heat cured in 1 to 2 hours at 150 to 200° C.

8. A dielectric resin composition according to claim 1, which further comprises colloidal silica as a thixotropic agent.

9. A dielectric resin composition comprising a polyimide resin with side chain epoxy groups, a cyanate ester with two or more cyanate groups in the molecule, and a metal ion catalyst system.

10. A dielectric resin composition according to claim 9, which is used as interlayer dielectric in multilayer circuit boards or which is used to bond a core substrate of a multilayer circuit board and a separately formed multilayer wiring structure.

11. A dielectric resin composition according to claim 9, wherein the number average molecular weight of said polyimide resin is between 5000 and 1 million.

12. A dielectric resin composition according to claim 9, wherein said metal ion catalyst system is an acetylacetonate of Cu(II), Co(II), Zn(II) or Mn(II), or a mixture thereof, and is used in an amount such that the active metal ion content is 100–500 parts per 1 million parts of the solid content of said composition.

13. A dielectric resin composition according to claim 9, wherein said polyimide resin is obtained by epoxidation of a polyimide with side chain hydroxyl groups that can be prepared by ring closure reaction of a polyamic acid precursor that is obtained by polymerization of a diamine and a tetracarboxylic dianhydride, at least one of which has a hydroxyl group in the molecule.

14. A dielectric resin composition according to claim 9, which can be heat cured in 1 to 2 hours at 180 to 250° C.

15. A dielectric resin composition according to claim 9, which further comprises colloidal silica as a thixotropic agent.

16. A dielectric resin composition according to claim 9, wherein the ratio of the epoxy functional groups of the polyimide resin to the cyanate groups of the cyanate ester is in the range of from 1:08 to 1:1.4.

17. A dielectric resin composition according to claim 9, wherein the ratio of the epoxy functional groups of the polyimide resin to the cyanate groups of the cyanate ester is in the range of from 1:08 to 1:1.

18. A multilayer circuit board having a multilayer structure comprising a core substrate and a required number of dielectric layers and wiring layers stacked alternately, wherein at least one of the dielectric layers is formed from a dielectric resin composition according to claim 1.

19. A multilayer circuit board having a multilayer structure comprising a core substrate and a required number of dielectric layers and wiring layers stacked alternately, wherein at least one of the dielectric layers is formed from a dielectric resin composition according to claim 9.

* * * * *